(12) United States Patent
Shafer et al.

(10) Patent No.: US 7,450,312 B2
(45) Date of Patent: Nov. 11, 2008

(54) OPTICAL PROJECTION LENS SYSTEM

(75) Inventors: David R. Shafer, Fairfield, CT (US); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 39 days.

(21) Appl. No.: 11/175,092

(22) Filed: Jul. 5, 2005

(65) Prior Publication Data

US 2005/0248853 A1     Nov. 10, 2005

Related U.S. Application Data

(63) Continuation of application No. 10/833,840, filed on Apr. 27, 2004, now Pat. No. 6,930,837, which is a continuation of application No. 10/393,593, filed on Mar. 20, 2003, now Pat. No. 6,791,761, which is a continuation of application No. 09/694,878, filed on Oct. 23, 2000, now Pat. No. 6,560,031.

(60) Provisional application No. 60/160,799, filed on Oct. 21, 1999.

(51) Int. Cl.
G02B 3/00     (2006.01)
(52) U.S. Cl. .................. 359/649; 359/754; 359/683
(58) Field of Classification Search .............. 359/649, 359/683, 690, 754, 785
See application file for complete search history.

(56) References Cited

U.S. PATENT DOCUMENTS

| | | | |
|---|---|---|---|
| 4,506,958 A | 3/1985 | Imai | 359/690 |
| 5,059,006 A | 10/1991 | Kikuchi et al. | 359/680 |
| 5,142,409 A * | 8/1992 | Hanzawa et al. | 359/355 |
| 5,260,832 A | 11/1993 | Togino et al. | 359/679 |
| 5,398,064 A | 3/1995 | Saka | 348/347 |
| 5,414,561 A | 5/1995 | Wakimoto et al. | 359/663 |
| 5,623,365 A | 4/1997 | Kuba | 359/569 |
| 5,636,000 A | 6/1997 | Ushida et al. | 355/30 |
| 5,694,241 A * | 12/1997 | Ishiyama et al. | 359/364 |
| 5,696,631 A | 12/1997 | Hoffman | 359/649 |
| 5,808,814 A * | 9/1998 | Kudo | 359/754 |
| 5,856,884 A | 1/1999 | Mercado | 359/649 |
| 5,969,803 A | 10/1999 | Mercado | 355/67 |
| 5,986,824 A | 11/1999 | Mercado | 359/754 |
| 5,990,926 A | 11/1999 | Mercado | 347/258 |

(Continued)

FOREIGN PATENT DOCUMENTS

DE     198 18 444 A     10/1998

(Continued)

OTHER PUBLICATIONS

European Search Report dated Jun. 19, 2001.

(Continued)

*Primary Examiner*—Mohammed Hasan
(74) *Attorney, Agent, or Firm*—Fish & Richardson P.C.

(57) ABSTRACT

An optical projection lens system for microlithography includes in the direction of propagating radiation: a first lens group having positive refractive power, a second lens group having negative refractive power and a waist (constriction) with a minimum diameter of the propagating radiation, and a further lens arrangement with positive refractive power, which follows the second lens group. At least one lens of the projection lens system which is arranged in front of the waist includes an aspherical surface.

24 Claims, 1 Drawing Sheet

U.S. PATENT DOCUMENTS

| | | | |
|---|---|---|---|
| 6,008,884 A | 12/1999 | Yamaguchi et al. | 355/53 |
| 6,084,723 A | 7/2000 | Matsuzawa et al. | 359/754 |
| 6,088,171 A | 7/2000 | Kudo | 359/754 |
| 6,166,865 A | 12/2000 | Matsuyama | 359/690 |
| 6,185,050 B1 | 2/2001 | Ota et al. | 359/691 |
| 6,195,213 B1 * | 2/2001 | Omura et al. | 359/727 |
| 6,198,576 B1 * | 3/2001 | Matsuyama | 359/649 |
| 6,259,508 B1 | 7/2001 | Shigematsu | 355/53 |
| 6,259,569 B1 | 7/2001 | Kasai | 359/690 |
| 6,349,005 B1 | 2/2002 | Schuster et al. | 359/754 |
| 6,377,338 B1 | 4/2002 | Suenaga | 355/67 |
| 6,496,306 B1 * | 12/2002 | Shafer et al. | 359/355 |
| 6,512,633 B2 | 1/2003 | Konno et al. | 359/557 |
| 6,538,821 B2 | 3/2003 | Takahshi | 359/649 |
| 6,560,031 B1 | 5/2003 | Shafer et al. | 359/649 |
| 6,606,144 B1 | 8/2003 | Omura | 355/67 |
| 6,674,513 B2 | 1/2004 | Omura | 355/67 |
| 6,683,729 B1 * | 1/2004 | Schuster | 359/656 |
| 7,130,129 B2 * | 10/2006 | Schultz et al. | 359/656 |
| 2003/0086183 A1 | 5/2003 | Wagner et al. | 359/754 |
| 2003/0179356 A1 | 9/2003 | Schuster et al. | 355/67 |
| 2003/0206282 A1 | 11/2003 | Omura | 355/67 |
| 2004/0120057 A1 | 6/2004 | Niendorf et al. | 359/872 |
| 2004/0206282 A1 | 6/2004 | Schuster | 359/649 |

FOREIGN PATENT DOCUMENTS

| | | |
|---|---|---|
| EP | 0 816 892 A | 1/1998 |
| EP | 1 235 092 A2 | 8/2002 |
| EP | 1 237 043 A2 | 8/2002 |
| EP | 1 245 984 A2 | 10/2002 |
| GB | 1088192 | 10/1967 |
| JP | 10-282411 | 10/1998 |
| JP | 10-325992 | 12/1998 |
| JP | 11-006957 | 1/1999 |
| JP | 11-095095 | 4/1999 |
| JP | 11-214293 | 8/1999 |

OTHER PUBLICATIONS

Bruning, John H. et al., "Optical Lithography—Thirty years and three orders of magnitude, The evolution of optical lithography tools", *SPIE*, vol. 3049, pp. 14-27 (1997).

Buckley, Jere D. et al., "Step and Scan: A systems overview of a new lithography tool", *SPIE*, vol. 1088, pp. 424-433 (1989).

Glatzel, E., "New Developments in Photographic Objectives", *Offprint from Optical Instruments and Techniques*, Oriel Press, pp. 413-415 (1969).

Glatzel, Erhard, "New Lenses for Microlithography", *SPIE*, vol. 237, pp. 310-320 (1980).

Sheats, James R. et al., *Microlithography Science and Technology*, pp. 263-270.

Woltche, Walter, "Optical Systems Design with Reference to the Evolution of the Double Gauss Lens", *SPIE*, vol. 237, pp. 202-205 (1980).

\* cited by examiner

OPTICAL PROJECTION LENS SYSTEM

CROSS-REFERENCE TO RELATED APPLICATIONS

Pursuant to 35 USC §120, this application is a continuation of and claims the benefit of prior U.S. patent application Ser. No. 10/833,840, filed Apr. 27, 2004 now U.S. Pat. No. 6,930,837 (allowed on Apr. 5, 2005); which is a continuation of and claims the benefit of prior U.S. patent application Ser. No. 10/393,593, filed Mar. 20, 2003, now U.S. Pat. No. 6,791,761 issued on Sep. 14, 2004; which is a continuation of and claims the benefit of prior U.S. patent application Ser. No. 09/694,878, filed Oct. 23, 2000, now U.S. Pat. No. 6,560,031, issued on May 6, 2003; which, in turn, claims the benefit under 35 U.S.C. §119(e) of prior U.S. provisional application 60/160,799, filed Oct. 21, 1999. The contents of the prior applications are incorporated herein by reference in their entirety.

STATEMENT REGARDING FEDERALLY SPONSORED RESEARCH TO DEVELOPMENT

Not applicable.

BACKGROUND OF THE INVENTION

This invention generally relates to an optical projection system comprising a light source, a mask holder, a projection lens system, and specifically relates to an optical projection system for photolithography used in producing microstructured devices, i.e., microlithography, such as integrated circuits or other semiconductor devices. During the fabrication of such devices, photolithography transfers an image from a photographic mask to a resultant pattern on a semiconductor wafer. Such photolithography generally includes a light exposure process, in which a semiconductor wafer is exposed to light having information of a mask pattern. Optical projection systems are used to perform the light exposure process.

In general, the transferred mask patterns are very fine, so that optical projection lens systems are required to have a high resolution. The high resolution necessitates a large numerical aperture of the optical projection lens system and also nearly no aberration of the optical projection lens system in the light exposure field.

For example, some projection lens systems are proposed in the German Patent Application DE 198 18 444 A1. The shown projection lens system comprises 6 lens groups. The first, third, fifth and sixth lens groups have positive refractive power and the second and fourth lens groups have negative refractive power. To get a high resolution in all shown examples, aspherical surfaces are in the fourth and fifth lens groups.

Some purely refractive projection exposure objectives of microlithography are discussed in SPIE Vol. 237 (1980), page 310 ff. There are shown objectives of the planar style and the distagon style, wherein the new style of objective comprises two waists for Petzval correction.

SUMMARY OF THE INVENTION

It is an object of this invention to provide a further excellent optical projection lens system for photolithography.

The optical projection lens system of the invention comprises in a direction of the light (propagating radiation) a first lens group having positive refractive power and a second lens group having negative refractive power and establishing a beam waist (i.e., constriction) of minimal beam height. A further lens arrangement follows the second lens group. At least one lens, which is arranged before the first beam waist, has an aspherical surface. Further, lenses comprising aspherical surfaces in all other groups will be helpful to reduce the needed amount of material and to reduce the length of the optical projection lens system.

DETAILED DESCRIPTION OF THE INVENTION

Figure 1:
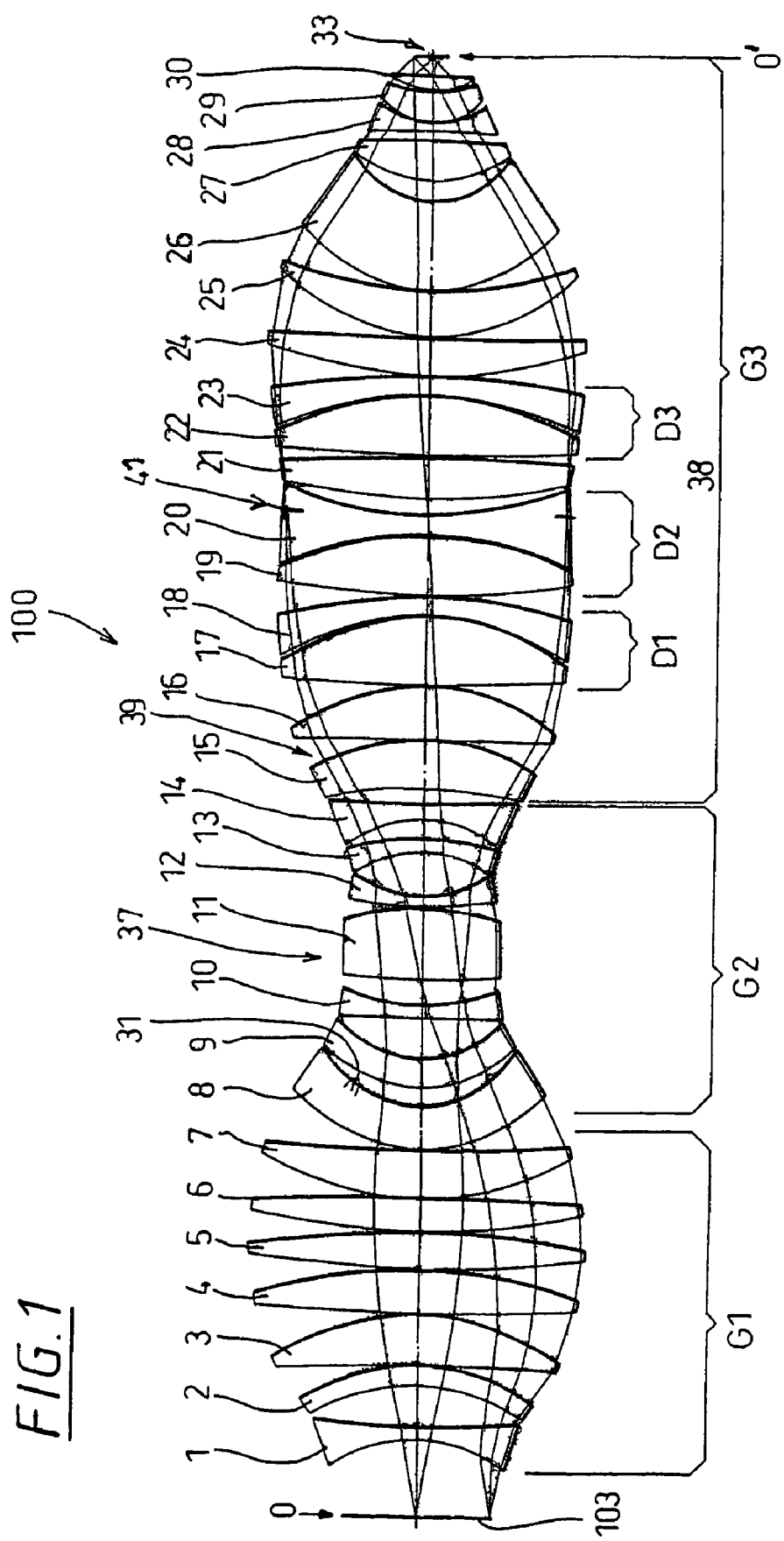
FIG. 1 is a cross section of an optical projection lens system according to an embodiment of the invention with only one clearly defined waist (i.e., constriction).

The optical projection lens system, shown in FIG. 1 comprises 30 lenses 1-30. This shown projection lens system is for wafer manufacture (i.e., a microlithography system). For illuminating a mask 103, which is positioned at 0, a light source with a narrow bandwidth is used. In this example, an excimer laser, which is not shown in the drawing, is used. The shown projection lens system is capable of being operated at 193.3 nm with a high numerical aperture of 0.7. This projection lens system is also adaptable to be operated at $\lambda=248$ nm or $\lambda=157$ nm.

A projection system comprising with this projection lens system the scale of the mask 103 projected on a wafer is reduced, wherein the wafer is positioned on 0'. The factor of scale reduction is 4 and the distance of 0 to 0' is 1000 mm. The illuminated image field is rectangular, e.g. 7×20 to 15×30 $mm^2$.

The present invention will be more fully understood from the detailed description given below and the accompanying drawing.

In the direction of propagating radiation, this projection lens system comprises a first lens group G1 comprising lenses 1 to 7 and a second lens group G2 comprising lenses 8 to 14, and a further lens arrangement G3 comprising lenses 15 to 30. The first lens group G1, has positive refractive power and ends with a lens 7 of refractive power.

The first lens 8 of the second lens group G2 is the first lens 8 behind the first belly of the projection lens system 100, which has a concave shaped lens surface 31 on the image side. In the example shown, this concave surface 31 has an aspherical shape. This aspherical surface 31 helps to reduce the track length, the number of needed lenses and helps to get a high image quality over the whole illuminated image field.

This second lens group G2 has negative refractive power and comprises a clearly defined waist portion (i.e., constriction) 37, which comprises seven lenses. The high number of lenses are needed for petzval correction, because there is only one clearly defined waist. There are three negative lenses 8-10 arranged in front of a lens 11 of positive refractive power in the middle of the lens group G2. Behind this positive lens 11 there are three further negative lenses 12-15.

The first lens 15 of the following lens arrangement G3 has positive refractive power. This is the first lens 15 of positive refractive power behind the lens 11 in the middle of the lens group G2. This lens arrangement G3 has positive refractive power and comprises lenses 15-30 of different materials and an aperture stop 41.

$CaF_2$ lenses 16, 17, 19, 21, 22, 29 and 30 are especially used. The other lenses are of quartz glass. These $CaF_2$ lenses are especially used for correction of chromatic aberration. This system comprises doublets D1, D2 and D3, which comprise a $CaF_2$ lens with positive refractive power followed by a quartz glass lens of negative refractive power. If no correction of chromatic aberration is required, as is usual in 248 nm systems, or possible with very narrow laser bandwidth, single lenses of the doublets D1-D3 can be taken, with the advantage of reducing the needed material and lenses.

A very shallow waist 38 is recognizable between lens 20 and lens 21.

The lens arrangement G3 has a maximum diameter of 238 mm.

The lens data of this embodiment are listed in the following Table 1. The aspheric surface is described mathematically by:

$$P(h) = \frac{\delta * h^2}{1 + (1 - (1 - EX) * \delta * h^2)} + C_1 h^4 + \ldots + C_n h^{2n-2}$$

with $\delta = 1/R$, wherein R is paraxial curvature and P is the sag as a function of the radius h.

TABLE 1

| LENS | RADIUS | THICKNESS | GLASS |
|---|---|---|---|
|  | UNENDL | 17.52 |  |
| L1 | −116.39 | 10.00 | SiO$_2$ |
|  | 617.53 | 31.49 |  |
| L2 | −143.96 | 15.00 | SiO$_2$ |
|  | −158.71 | 0.50 |  |
| L3 | −1180.69 | 37.72 | SiO$_2$ |
|  | −191.12 | 0.50 |  |
| L4 | 2484.02 | 31.18 | SiO$_2$ |
|  | −409.87 | 0.50 |  |
| L5 | 864.05 | 28.13 | SiO$_2$ |
|  | −720.08 | 0.50 |  |
| L6 | 566.89 | 25.00 | SiO$_2$ |
|  | −5256.53 | 0.50 |  |
| L7 | 230.42 | 36.66 | SiO$_2$ |
|  | 1542.90 | 0.50 |  |
| L8 | 132.99 | 31.60 | SiO$_2$ |
|  | 84.39 | 12.54 |  |
| L9 | 101.03 | 22.70 | SiO$_2$ |
|  | 80.07 | 30.80 |  |
| L10 | −7281.27 | 10.00 | SiO$_2$ |
|  | 139.12 | 20.25 |  |
| L11 | 962.49 | 53.36 | SiO$_2$ |
|  | −190.49 | 0.50 |  |
| L12 | 348.09 | 9.00 | SiO$_2$ |
|  | 96.42 | 32.28 |  |
| L13 | −94.72 | 11.00 | SiO$_2$ |
|  | −203.97 | 14.37 |  |
| L14 | −91.49 | 13.00 | SiO$_2$ |
|  | 4787.89 | 10.28 |  |
| L15 | −329.06 | 36.69 | SiO$_2$ |
|  | −173.40 | 0.50 |  |
| L16 | −2176.02 | 40.00 | CaF$_2$ |
|  | −161.94 | 1.00 |  |
| L17 | 1885.09 | 50.00 | CaF$_2$ |
|  | −195.36 | 0.48 |  |
| L18 | −198.97 | 15.00 | SiO$_2$ |
|  | −389.14 | 0.50 |  |
| L19 | 687.29 | 45.10 | CaF$_2$ |
|  | −254.11 | 0.10 |  |
| L20 | −261.96 | 15.00 | SiO$_2$ |
|  | 261.17 | 13.27 |  |
| L21 | 530.40 | 32.00 | CaF$_2$ |
|  | −1166.11 | 0.50 |  |
| L22 | 1879.17 | 45.00 | CaF$_2$ |
|  | −237.88 | 0.10 |  |
| L23 | −271.21 | 15.00 | SiO$_2$ |
|  | −609.73 | 0.50 |  |
| L24 | 351.48 | 30.00 | SiO$_2$ |
|  | 100200.00 | 0.50 |  |
| L25 | 157.95 | 34.26 | SiO$_2$ |
|  | 329.33 | 0.50 |  |
| L26 | 125.26 | 67.46 | SiO$_2$ |
|  | 69.91 | 16.27 |  |
| L27 | 102.35 | 30.27 | SiO$_2$ |
|  | −1072.95 | 7.25 |  |

TABLE 1-continued

| LENS | RADIUS | THICKNESS | GLASS |
|---|---|---|---|
| L28 | −914.82 | 5.00 | SiO$_2$ |
|  | 63.74 | 0.50 |  |
| L29 | 53.45 | 23.33 | CaF$_2$ |
|  | 82.67 | 0.50 |  |
| L30 | 60.16 | 10.70 | CaF$_2$ |
|  | 1256.42 | 15.34 |  |

Aspheric Constants
$EX = 0.139140 * 10^{-8}$
$C_1 = 0.178710 * 10^{12}$
$C_2 = 0.601290 * 10^{-17}$
$C_3 = 0.253200 * 10^{-20}$ The maximum beam diameter is 238 mm ad the track length is 1000 mm, wherein the numerical aperture is NA=0.7. This results in a very compact construction with reduced cost for lens material.

The implementation of CaF$_2$ lenses 16, 17, 19, 21, 22 effects a good correction of chromatic aberration of this compact embodiment. The last two CaF$_2$ lenses 29, 30 at the end of the lens arrangement G3 are inserted for their resistance versus compaction.

As those skilled in the art of optical projection lens systems will readily appreciate, numerous substitutions, modifications and additions may me made to the above design without departing from the spirit and scope of the present invention. It is intended that all such substitutions, modifications, and additions fall within the scope of the invention, which is defined by the claims.

We claim:

1. A lens system, comprising:
   lenses of quartz glass, and
   at least three lenses of CaF$_2$,
   wherein the lens system is a dioptric lens system configured to project light from a mask onto a wafer, and
   the lens system has a maximal optically free diameter greater than 0.2 times a distance from an object side object plane and an image side image plane into which the object plane is imaged by the optical projection lens.

2. The lens system according to claim 1, wherein the lens system includes at least three CaF$_2$ lenses which are biconvex lenses.

3. The lens system according to claim 1, wherein a last lens element in the lens system along an optical path through the lens system is a CaF$_2$ lens.

4. The lens system according to claim 1, wherein the lens system includes at least one aspheric lens.

5. The lens system according to claim 1, wherein the lens system includes an aperture diaphragm, and the lens system further includes a lens with negative refractive power following the aperture diaphragm, which has a diameter of at least 0.9 times the maximal optically free diameter.

6. The lens system according to claim 5, wherein the aperture diaphragm has a diameter of between 0.95 and 1.05 of the maximal optically free diameter.

7. The lens system according to claim 1, wherein the lens system comprises three doublets, each comprising a CaF$_2$ lens with positive refractive power and a quartz glass lens of negative refractive power.

8. The lens system according to claim 1, further comprising an aperture stop and a lens of quartz glass having a negative refractive power, the lens of quartz glass being arranged in the immediate neighborhood of the aperture stop.

9. The lens system of claim 1, wherein the lens system has a numerical aperture greater than 0.65.

10. A lens system, comprising:
lenses of quartz glass,
an aperture stop,
a first lens being arranged in the immediate neighborhood of the aperture stop, and at least three lenses of $CaF_2$ including a biconvex lens of $CaF_2$,
wherein the biconvex lens of $CaF_2$ is between the aperture stop and the first lens, the lens system is a dioptric lens system configured to project light from a mask onto a wafer,
the lens system has a maximal optically free diameter greater than 0.2 times a distance from an object side object plane and an image side image plane into which the object plane is imaged by the optical projection lens.

11. The lens system according to claim 1, wherein the lens system further comprises:
an aperture stop,
a first lens being arranged in the immediate neighborhood of the aperture stop, and a biconvex lens of $CaF_2$.

12. The lens system according to claim 10, wherein each of the at least three lenses of $CaF_2$ is a bi-convex lens.

13. The lens system according to claim 10, wherein a last lens element of the lens system along an optical path through the lens system is a $CaF_2$ lens.

14. The lens system according to claim 10, wherein the lens system includes at least one aspherical lens.

15. The lens system according to claim 10, wherein the lens system includes an aperture diaphragm and a lens with negative refractive power following the aperture diaphragm, the aperture diaphragm having a diameter of at least 0.9 times the maximal optically free diameter.

16. The lens system according to claim 10, wherein the aperture diaphragm has a diameter of between 0.95 and 1.05 of the maximal optically free diameter.

17. The lens system according to claim 10, wherein the lens system comprises three doublets, each doublet comprising a $CaF_2$ lens with positive refractive power and a quartz glass lens of negative refractive power.

18. The lens system of claim 10, wherein the lens system has a numerical aperture greater than 0.65.

19. A lens system, comprising:
lenses of quartz glass, and
at least three lenses of $CaF_2$,
wherein the lens system is a dioptric lens system configured to project light from a mask onto a wafer and the lens system comprises three doublets, each comprising a $CaF_2$ lens with positive refractive power and a quartz glass lens of negative refractive power.

20. The lens system according to claim 19, wherein a last lens element in the lens system along an optical path through the lens system is a $CaF_2$ lens.

21. The lens system according to claim 19, wherein the lens system includes at least one aspheric lens.

22. The lens system according to claim 19, wherein the lens system includes an aperture diaphragm, and the lens system further includes a lens with negative refractive power following the aperture diaphragm, which has a diameter of at least 0.9 times the maximal optically free diameter.

23. The lens system according to claim 22, wherein the aperture diaphragm has a diameter of between 0.95 and 1.05 of the maximal optically free diameter.

24. The lens system according to claim 19, wherein the lens system further comprises:
an aperture stop,
a first lens being arranged in the immediate neighborhood of the aperture stop, and
a biconvex lens of $CaF_2$.

* * * * *

UNITED STATES PATENT AND TRADEMARK OFFICE
CERTIFICATE OF CORRECTION

PATENT NO.         : 7,450,312 B2
APPLICATION NO. : 11/175092
DATED                 : November 11, 2008
INVENTOR(S)       : David R. Shafer and Wilhelm Ulrich Page 1 of 1

It is certified that error appears in the above-identified patent and that said Letters Patent is hereby corrected as shown below:

Column 1, line 21, delete "TO" insert --OR--.

Column 4, line 13, delete "$10^{12}$" insert --$10^{-12}$--.

Signed and Sealed this

Sixth Day of January, 2009

JON W. DUDAS
*Director of the United States Patent and Trademark Office*